US012635405B2

(12) United States Patent
Li

(10) Patent No.: US 12,635,405 B2
(45) Date of Patent: May 19, 2026

(54) QUANTUM DOT MATERIAL AND PREPARATION METHOD THEREFOR, QUANTUM DOT DISPLAY DEVICE, DISPLAY APPARATUS, METHOD FOR PATTERNING QUANTUM DOT FILM, AND METHOD FOR FABRICATING QUANTUM DOT LIGHT-EMITTING DEVICE

(71) Applicants: Beijing BOE Technology Development Co., Ltd., Beijing (CN); BOE Technology Group Co., Ltd., Beijing (CN)

(72) Inventor: Zhuo Li, Beijing (CN)

(73) Assignees: Beijing BOE Technology Development Co., Ltd;, Beijing (CN); BOE Technology Group Co., Ltd., Beijing (CN)

( * ) Notice: Subject to any disclaimer, the term of this patent is extended or adjusted under 35 U.S.C. 154(b) by 406 days.

(21) Appl. No.: 18/265,687

(22) PCT Filed: Jul. 22, 2022

(86) PCT No.: PCT/CN2022/107380

§ 371 (c)(1),
(2) Date: Jun. 7, 2023

(87) PCT Pub. No.: WO2023/005840

PCT Pub. Date: Feb. 2, 2023

(65) Prior Publication Data

US 2024/0147838 A1 May 2, 2024

(30) Foreign Application Priority Data

Jul. 30, 2021 (CN) ........................ 202110874634.X

(51) Int. Cl.
*H10K 85/30* (2023.01)
*C09K 11/02* (2006.01)
(Continued)

(52) U.S. Cl.
CPC .......... *H10K 85/381* (2023.02); *C09K 11/025* (2013.01); *H10K 85/30* (2023.02);
(Continued)

(58) Field of Classification Search
None
See application file for complete search history.

(56) References Cited

U.S. PATENT DOCUMENTS

2019/0131587 A1 5/2019 Chen
2020/0270517 A1 8/2020 Bisri et al.
(Continued)

FOREIGN PATENT DOCUMENTS

CN 102432497 A 5/2012
CN 106957650 A 7/2017
(Continued)

OTHER PUBLICATIONS

International Search Report for PCT/CN2022/107380 Mailed Oct. 25, 2022.
(Continued)

*Primary Examiner* — Anthony Ho
(74) *Attorney, Agent, or Firm* — Ling Wu; Stephen Yang; Ling and Yang Intellectual Property

(57) ABSTRACT

A quantum dot material includes: a quantum dot and a ligand for modifying the quantum dot. The ligand is coordinately bound to the quantum dot, has a photosensitive isomerization property, is a derivative of azobenzene, and contains a urea group and a pyrimidinone group.

18 Claims, 3 Drawing Sheets

Formula (I) Formula (I')

(51) Int. Cl.

| | |
|---|---|
| *B82Y 20/00* | (2011.01) |
| *B82Y 40/00* | (2011.01) |
| *H10K 50/115* | (2023.01) |

(52) U.S. Cl.

CPC ............ *H10K 85/321* (2023.02); *B82Y 20/00* (2013.01); *B82Y 40/00* (2013.01); *H10K 50/115* (2023.02)

(56) References Cited

U.S. PATENT DOCUMENTS

| | | | |
|---|---|---|---|
| 2020/0332181 | A1 | 10/2020 | Zhang |
| 2022/0010203 | A1 | 1/2022 | Stubbs et al. |

FOREIGN PATENT DOCUMENTS

| | | | |
|---|---|---|---|
| CN | 107799672 | A | 3/2018 |
| CN | 109020851 | A | 12/2018 |
| CN | 109266350 | A | 1/2019 |
| CN | 109928903 | A | 6/2019 |
| CN | 109935670 | A | 6/2019 |
| CN | 109935713 | A | 6/2019 |
| CN | 109935724 | A | 6/2019 |
| CN | 110055052 | A | 7/2019 |
| CN | 113046058 | A | 6/2021 |
| JP | 2013209327 | A | 10/2013 |
| TW | 202025534 | A | 7/2020 |
| WO | 2010056210 | A1 | 5/2010 |
| WO | 2019114829 | A1 | 6/2019 |
| WO | 2020099826 | A1 | 5/2020 |

OTHER PUBLICATIONS

Tian-Guang Zhan et al., "Visible-Light Responsive Hydrogen-Bonded Supramolecular Polymers Based on ortho-Tetrafluorinated Azobenzene", Polym. Chem., 2017, DOI: 10.1039/C7PY01612C.

Abdiaziz A. Farah et al., "Using a Push-Pull Azobenzene Haptan to Probe Surface-Core Electronic Communication in Surface-Functionalized CdS Quantum Dots", J. Phys. Chem. C, vol. 114, No. 48, 2010, 20410-20416.

Lu Wei et al., "Towards photoswitchable quadruple hydrogen bonds via a reversible "photolocking" strategy for photocontrolled self-assembly", Chem. Sci., 2021, 12, 1762-1771.

Yongchao Zha et al., "Stimuli-responsive azobenzene-quantum dots for multi-sensing of dithionite, hypochlorite, and azoreductase", Microchim Acta, 2020, 187: 481.

Laura Osorio-Planes et al., "Photoswitchable Thioureas for the External Manipulation of Catalytic Activity", Org. Lett. 2014, 16, 1704-1707.

Shomaila Saeed et al., "Photoresponsive azobenzene ligand as an efficient electron acceptor for luminous CdTe quantum dots", Journal of Photochemistry & Photobiology A: Chemistry, 375, 2019, 48-53.

Hina Javed et al., "Fluorescence modulation of cadmium sulfide quantum dots by azobenzene photochromic switches", Proc. R.Soc., A 472: 20150692.

Shomaila Saeed et al., "Charge/energy transfer dynamics in CuO quantum dots attached to photoresponsive azobenzene ligand", Journal of Photochemistry & Photobiology A: Chemistry, 371, 2019, 44-49.

Office Action dated Apr. 24, 2024 for Chinese Patent Application No. 202110874634.X and English Translation.

Formula (I)

Formula (I')

QUANTUM DOT MATERIAL AND PREPARATION METHOD THEREFOR, QUANTUM DOT DISPLAY DEVICE, DISPLAY APPARATUS, METHOD FOR PATTERNING QUANTUM DOT FILM, AND METHOD FOR FABRICATING QUANTUM DOT LIGHT-EMITTING DEVICE

CROSS-REFERENCE TO RELATED APPLICATIONS

This application is a national stage application of PCT Application No. PCT/CN2022107380, which is filed on Jul. 22, 2022, and claims the priority of the Chinese patent application filed with the Patent Office of China on Jul. 30, 2021, with the application number of 202110874634. X and the invention title of "Quantum Dot Material, Preparation Method and Application Thereof, Method for Patterning Quantum Dot Film, and Method for Fabricating Quantum Dot Light Emitting-Device", the contents of which should be understood as being incorporated into the present disclosure by reference.

TECHNICAL FIELD

Embodiments of the present disclosure relate to, but are not limited to, the display technical field, in particular to a quantum dot material and a preparation method therefor, a quantum dot display device, a display apparatus, a method for patterning a quantum dot film and a method for fabricating a quantum dot light-emitting device.

BACKGROUND

Quantum Dots Light Emitting Diode (QLED) is a new display technology based on an organic light-emitting display. A light-emitting layer in QLED is a quantum dot layer, and its principle is that electrons and holes are injected into the quantum dot layer and then light emits in the quantum dot layer. QLED is a potential next generation self-luminous display technology. Compared with Organic Light-Emitting Diode (OLED), QLED has the prominent advantages of lower energy consumption, higher color purity and wider color gamut. The application goal of QLED technology is high-resolution dynamic full-color display. The accurate preparation of QLED sub-pixel region is the premise of realizing high-resolution dynamic full-color display, which requires accurate patterning of quantum dot light-emitting layer.

SUMMARY

The following is a summary of subject matters described herein in detail. The summary is not intended to limit the protection scope of the disclosure.

An embodiment of the present disclosure provides a quantum dot material including a quantum dot and a ligand for modifying the quantum dot, wherein the ligand is coordinately bound to the quantum dot, has a photosensitive isomerization property, is a derivative of azobenzene, and contains a urea group and a pyrimidinone group.

In an exemplary embodiment, the ligand is configured to present a cis-structure with a quadruple hydrogen bond formed between molecules of the ligand after being irradiated by ultraviolet light, and present a trans structure with a hydrogen bond formed within the molecules of the ligand after being irradiated by visible light.

In an exemplary embodiment, the general structural formula of the ligand may be:

Formula (I)

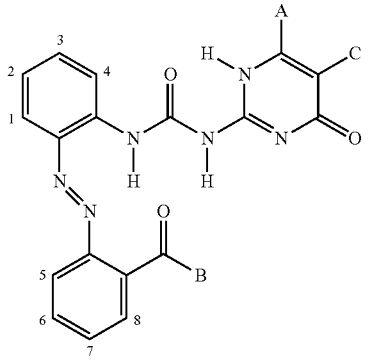

where at least one of A, B and C contains a coordination group capable of coordinately binding to the quantum dot.

In an exemplary embodiment, the coordination group may be selected from any one or more of mercapto (—SH), hydroxyl (—OH), amine (—N-or-NH), amino $(NH)_2$, carboxyl (—COOH), ester (—COO—), phosphine (—P), and phosphine oxy (or phosphine oxide, O═P).

In an exemplary embodiment, A is $(CH_2)_X$—Y, where 0≤x≤12, and Y is the coordination group; and C is hydrogen; or A is hydrogen; C is $(CH_2)_X$—Y, where 0≤x≤12; and Y is the coordination group.

In an exemplary embodiment, B may be selected from any one of the following groups:

(1) —O—$CH_3$; or (2)

$$*-(CH_2)_m-R_0,$$

where m≥10, and $R_0$ is —$CH_3$ or phenyl;

(3) a group containing thiophene or polythiophene;

(4) fluoroalkyl or perfluoroalkyl;

(5) a group or segment containing a carbon-carbon double bond; and (6) a group or segment containing a carbon-carbon triple bond.

In an exemplary embodiment, the group containing thiophene or polythiophene may include

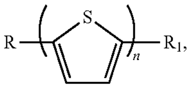

where R represents a connection end connected to a main body of the ligand, R is an alkyl group or an alkyl group connected with an amide bond or an amino group, $R_1$ represents a free end, $R_1$ is methyl, ethyl or methoxy, and 1≤n≤10.

In an exemplary embodiment, the group containing thiophene or polythiophene may include

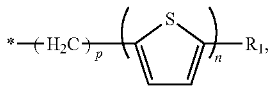 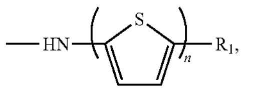 and

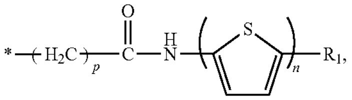

where $R_1$ represents a free end, $R_1$ is methyl, ethyl or methoxy, p≤3, and 1≤n≤10.

In an exemplary embodiment, the perfluoroalkyl may include —$(CF_2)$ q-$CF_3$, where q>5.

In an exemplary embodiment, the group or segment containing a carbon-carbon double bond may include

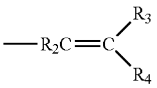 and 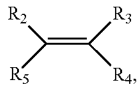

where $R_2$, $R_3$, and $R_4$ represent free ends, $R_2$, $R_3$, and $R_4$ may each independently be any one of hydrogen (H), fluorine (F), methyl $(CH)_3)$, ethyl (—$CH_2$—$CH_3$), propyl and other short-chain alkyl groups, $R_5$ represents a connection end connected to a main body of the ligand, and $R_5$ may be an alkyl group or an alkyl group connected with an amide bond or an amino group.

In an exemplary embodiment, the group containing a carbon-carbon triple bond may include

where $R_6$ represents a connection end connected to a main body of the ligand, $R_6$ may be an alkyl group or an alkyl group connected with an amide bond or an amino group, $R_7$ is a free end, and $R_7$ may be any one of hydrogen (H), methyl $(CH)_3)$, ethyl (—$CH_2$—$CH_3$), propyl (—$CH_2$—$CH_2$—$CH_3$), and other short-chain alkyl groups.

In an exemplary embodiment, sites 1 to 8 in the general structural formula of the ligand may each independently be hydrogen and fluorine.

In an exemplary embodiment, sites 1 to 8 in the general structural formula of the ligand may all be fluorine.

In an exemplary embodiment, the quantum dot may be selected from any one of more of CdS, CdSe, ZnSe, InP, PbS, $CsPbCl_3$, $CsPbBr_3$, $CsPhI_3$, CdS/ZnS, CdSe/ZnS, ZnSe, ZnTeSe, ZnSe/ZnS, ZnTeSe/ZnS, InP/ZnS, PbS/ZnS, $CsPbC_3$/ZnS, $CsPbBr_3$/ZnS and $CsPhI_3$/ZnS.

An embodiment of the present disclosure further provides a preparation method for the quantum dot material, including the following steps:

providing an initial quantum dot containing an oil-soluble ligand; and using a ligand to perform ligand exchange with the oil-soluble ligand on a surface of the initial quantum dot to obtain the quantum dot material.

In an exemplary embodiment, the step of using the ligand to perform ligand exchange with the oil-soluble ligand on the surface of the initial quantum dot to obtain the quantum dot material may include:

dissolving the ligand in an organic solvent to obtain a ligand solution;

adding the initial quantum dot into the ligand solution to obtain a ligand solution containing the initial quantum dot, stirring to make the ligand perform ligand exchange with the oil-soluble ligand on the surface of the initial quantum dot; and adding the solution after the ligand exchange into an undesirable solvent of the ligand so that the quantum dot containing the ligand is precipitated and separated from the solution to obtain the quantum dot material.

In an exemplary embodiment, in the ligand solution containing the initial quantum dot, a concentration of the ligand may be 3 times to 100 times a mass concentration of the initial quantum dot.

In an exemplary embodiment, in the ligand solution containing the initial quantum dot, a mass concentration of the ligand may be 100 mg/mL to 800 mg/mL, and a concentration of the initial quantum dot may be 10 mg/mL to 30 mg/mL.

In an exemplary embodiment, a time period for ligand exchange may be 4 hours or more.

In an exemplary embodiment, the organic solvent may be selected from any one or more of toluene, xylene and chloroform.

In an exemplary embodiment, the undesirable solvent may be selected from any one or more of acetone, ethyl acetate and methanol.

An embodiment of the present disclosure further provides a quantum dot display device, which may be at least one of a quantum dot light-emitting device, a quantum dot-organic light-emitting diode, a quantum dot-liquid crystal display device, or a quantum dot-miniature light-emitting diode, and the quantum dot display device includes the quantum dot material as described above.

In an exemplary embodiment, the quantum dot display device is a quantum dot light-emitting device that includes an anode, a cathode, and a quantum dot light-emitting layer sandwiched between the anode and the cathode, wherein the quantum dot light-emitting layer is made from the quantum dot material as described above.

In an exemplary embodiment, the quantum dot display device is at least one of a quantum dot-organic light-emitting diode, a quantum dot-liquid crystal display device, or a quantum dot-miniature light-emitting diode, and the quantum dot display device includes a color conversion layer which is made from the quantum dot material as described above.

An embodiment of the present disclosure further provides a display apparatus, which includes a plurality of the quantum dot light-emitting devices as described above.

An embodiment of the present disclosure further provides a method for patterning a quantum dot film, which includes the following steps:

forming a quantum dot film, wherein the quantum dot film is made from the quantum dot material as described above;

irradiating the quantum dot film in a retention region with ultraviolet light so that a ligand of the quantum dot material in the retention region presents a cis-structure and a quadruple hydrogen bond is formed between molecules of the ligand; and removing the quantum dot film in a non-retention region to obtain a patterned quantum dot film.

An embodiment of the present disclosure further provides a method for fabricating a quantum dot light-emitting device, which includes the following steps:

forming a first electrode;

forming a patterned quantum dot film as a quantum dot light-emitting layer by adopting the method for patterning the quantum dot film as described above; and forming a second electrode.

Other aspects may be understood upon reading and understanding the drawings and detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

DETAILED DESCRIPTION

Figure 1:
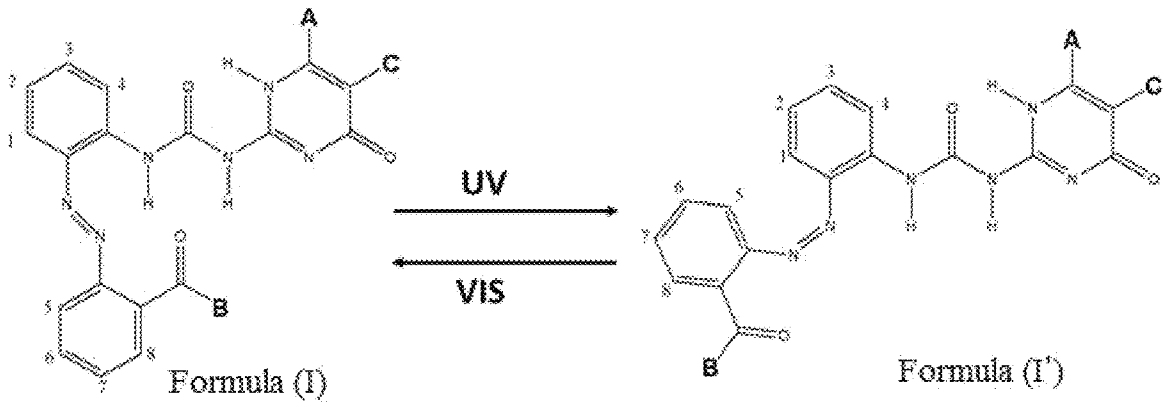
FIG. 1 is a transition diagram showing cis/trans-conformational changes of molecules of a ligand of general structural formula (I) under ultraviolet/visible light according to an exemplary embodiment of the present disclosure.

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementation modes only. The embodiments in the present disclosure and features in the embodiments may be combined randomly with each other without conflict.

In the accompanying drawings, a size of a constituent element, and a thickness of a layer or a region is sometimes exaggerated for clarity. Therefore, any one embodiment of the present disclosure is not necessarily limited to dimensions shown in the drawings, and the shapes and sizes of the components in the accompanying drawings do not reflect actual scales. In addition, the accompanying drawings schematically show an ideal example, and any one embodiment of the present disclosure is not limited to the shapes, values, or the like shown in the accompanying drawings.

In the specification, a "film" and a "layer" are interchangeable. For example, "quantum dot film" can sometimes be replaced by "quantum dot layer".

An embodiment of the present disclosure provides a quantum dot material including a quantum dot and a ligand for modifying the quantum dot, wherein the ligand is coordinately bound to the quantum dot, has a photosensitive isomerization property, is a derivative of azobenzene, and contains a urea group and a pyrimidinone group.

According to the quantum dot material of the embodiment of the present disclosure, a compound with photosensitive isomerization characteristics is used as a ligand for modifying the quantum dot, and the ligand can not only passivate defect sites and hanging bonds on a surface of the quantum dot, but also make the quantum dot material have reversible photosensitive crosslinking characteristics.

In an exemplary embodiment, the ligand is configured to present a cis-structure with a quadruple hydrogen bond formed between molecules of the ligand after being irradiated by ultraviolet light, and present a trans structure with a hydrogen bond formed within the molecules of the ligand after being irradiated by visible light.

Under the irradiation of ultraviolet light, a quadruple hydrogen bond is formed between ligand molecules of the quantum dot material according to the exemplary embodiment of the present disclosure, and the quantum dot material forms a cross-linking structure under the action of the quadruple hydrogen bond between ligand molecules, which may improve the stability of the quantum dot material. Therefore, a quantum dot film with good stability and difficult dissolution may be obtained using the quantum dot material as described above. Under the irradiation of visible light, a hydrogen bond is formed within ligand molecules, the quadruple hydrogen bond between ligand molecules is released, therefore, and the cross-linking between the molecules of the quantum dot material is released, therefore, the quantum dot material may be dissolved in the solvent.

Therefore, when the quantum dot light-emitting layer is prepared using the quantum dot material according to the exemplary embodiment of the present disclosure and the quantum dot light-emitting device is fabricated using the quantum dot light-emitting layer, the following beneficial technical effects may be obtained:

1. Since the quantum dot material according to the exemplary embodiment of the present disclosure may be crosslinked under ultraviolet light, a patterned quantum dot light-emitting layer may be prepared with the quantum dot material according to the exemplary embodiment of the present disclosure using a photolithography technique;
2. Under the irradiation of ultraviolet light, the ligand of the quantum dot material according to the exemplary embodiment of the present disclosure has a cis-structure, and the ligand molecules are easy to form a hydrogen bond with some common front film layers (i.e., films formed before the formation of the quantum dot light-emitting layer in the process of fabricating the quantum dot light-emitting device, for example, the films rich in hydroxyl group on the surface, such as ZnO, ZnMgO, ZnAlO and other Electron Transport Layers (ETL) as well as $MoO_3$, Nickel oxide (NiO), vanadium oxide ($V_2O_5$) and other Hole Transport Layers (HTL)), so that the quantum dot light-emitting layer in the region irradiated by ultraviolet light may be more tightly bound to a substrate, thereby improving the stability of the quantum dot light-emitting layer.
3. Since the cross-linking between the molecules of the quantum dot material according to the exemplary embodiment of the present disclosure is reversible cross-linking based on the change of molecular conformation, this provides a feasible way for the rework of the quantum dot light-emitting layer in the mass production process in the production line. When the rework is needed, the quantum dot light-emitting layer may be irradiated with visible illumination to uncross-link the quantum dot material, so that the quantum dot light-emitting layer may be easily removed from the substrate (such as redissolution, etc.), and then the preparation of related technological processes is re-performed, which is beneficial to cost saving in the mass production process.

In an exemplary embodiment, the general structural formula of the ligand may be:

Formula (I)

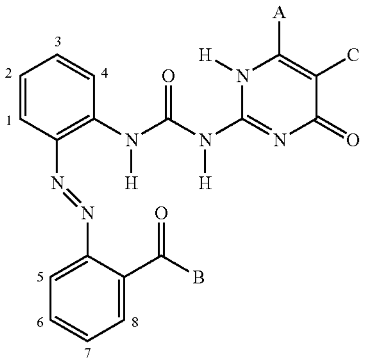

where A, B and C represent any chemical atom, chemical group or molecular fragment (including a single chemical group and a complex chemical molecular fragment composed of a plurality of groups or atoms) that may be located at the site, but at least one of A, B and C contains a coordination group that may be coordinately bound to the quantum dot.

FIG. 1 is a transition diagram showing cis/trans-conformational changes of molecules of a ligand of general structural formula (I) under ultraviolet/visible light according to an exemplary embodiment of the present disclosure. As shown in FIG. 1, after being irradiated by ultraviolet light, the ligand molecules present a cis-structure as shown by formula (I); and after being irradiated by visible light, the ligand molecules present a trans structure as shown by formula (I').

Figure 2:
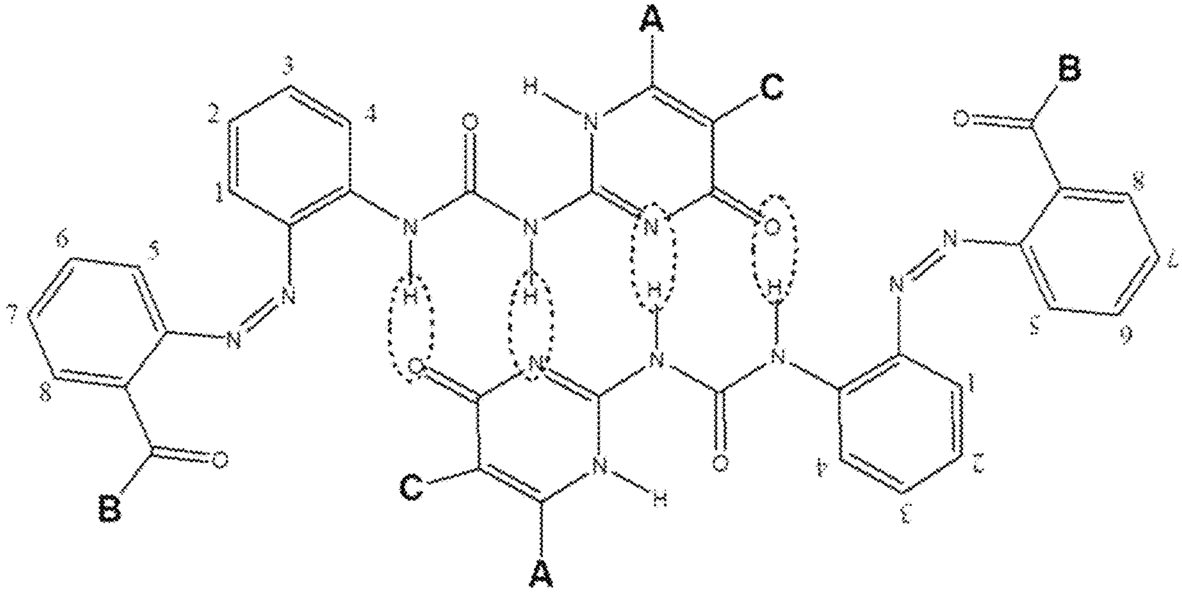
FIG. 2 is a schematic diagram of a quadruple hydrogen bond formed between molecules of a ligand of general structural formula (I) according to an exemplary embodiment of the present disclosure.

FIG. 2 is a schematic diagram of a quadruple hydrogen bond formed between molecules of a ligand of general structural formula (I) according to an exemplary embodiment of the present disclosure, with dotted lines indicating sites at which the intermolecular hydrogen bond is formed. As shown in FIG. 2, when the ligand molecules of general formula (I) have a cis-structure, a quadruple hydrogen bond may be formed between two ligand molecules.

Figure 3:
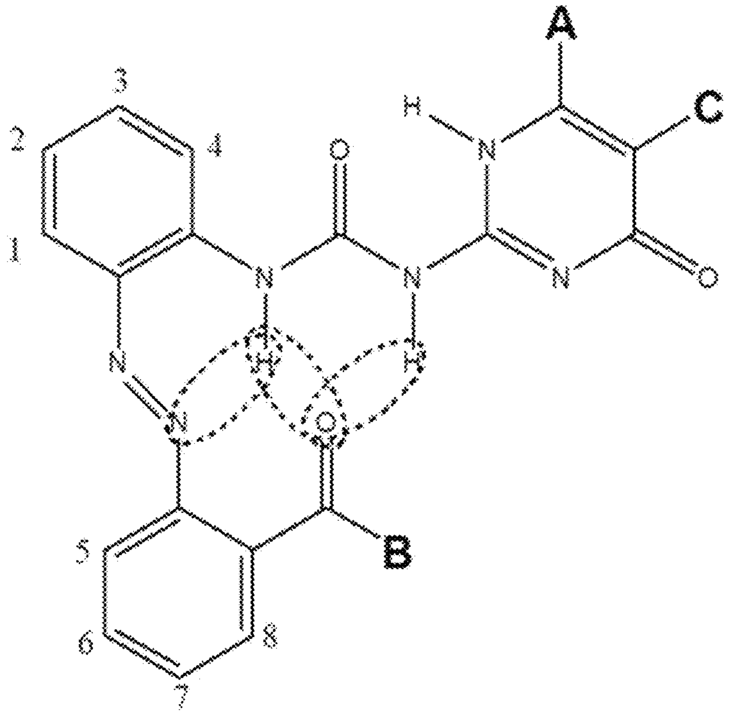
FIG. 3 is a schematic diagram of a hydrogen bond formed within molecules of a ligand of general structural formula (I) according to an exemplary embodiment of the present disclosure.

FIG. 3 is a schematic diagram of a hydrogen bond formed within molecules of a ligand of general structural formula (I) according to an exemplary embodiment of the present disclosure, with dotted lines indicating sites at which the intermolecular hydrogen bond is formed. As shown in FIG. 3, when the ligand molecules of general formula (I) have a trans structure, hydrogen bonds are formed within the molecules, and the quadruple hydrogen bonds between the ligand molecules are released.

In an exemplary embodiment, the coordination group may be selected from any one or more of mercapto (—SH), hydroxyl (—OH), amine (—N-or-NH), amino $(NH)_2$, carboxyl (—COOH), ester (—COO—), phosphine (—P), and phosphine oxy (or phosphine oxide, O═P). The ligand is coordinately bound to the quantum dot through the coordination group, which plays the role of passivating defect sites and hanging bonds on the surface of the quantum dot.

In an exemplary embodiment, a length of the ligand may be adjusted and designed according to different requirements of the quantum dot for the length of the ligand molecule.

In an exemplary embodiment, A is $(CH_2)_X$—Y, where $0 \le x \le 12$, and Y is the coordination group; and C is hydrogen; or, A is Hydrogen; C is $(CH_2)_X$—Y, where $0 \le x \le 12$; and Y is the coordination group.

In an exemplary embodiment, B may be selected from any one of the following groups:

(1) —O—$CH_3$; or (2)

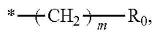

where $m \ge 10$, and $R_0$ is —$CH_3$ or phenyl;

(3) a group containing thiophene or polythiophene;

(4) fluoroalkyl or perfluoroalkyl;

(5) a group or segment containing a carbon-carbon double bond; and (6) a group or segment containing a carbon-carbon triple bond.

When B is

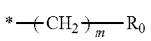

($m \ge 10$, and $R_0$ is —$CH_3$ or phenyl), B is a long chain hydrocarbon, so that the quantum dot material according to the embodiment of the present disclosure may play the role of blocking electrons, thereby reducing electron injection and adjusting the injection balance of carriers.

In an exemplary embodiment, the group containing thiophene or polythiophene may include

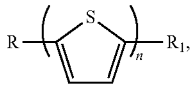

where R represents a connection end connected to a main body of the ligand, R is an alkyl group or an alkyl group connected with an amide bond or an amino group, $R_1$ represents a free end, $R_1$ is methyl, ethyl or methoxy, and $1 \le n \le 10$.

In an exemplary embodiment, the group containing thiophene or polythiophene may include

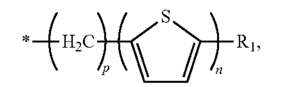

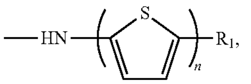

and

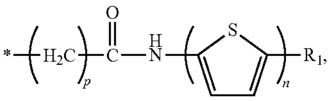

where $R_1$ represents a free end, $R_1$ is methyl, ethyl or methoxy, p≤3, and 1≤n≤10.

When B is a group containing thiophene or polythiophene, the hole transport capability of the quantum dot material according to the embodiment of the present disclosure may be improved, thereby improving hole injection, and further facilitating the balance of carrier injection in the QLED device fabricated by adopting the quantum dot material according to the embodiment of the present disclosure.

In an exemplary embodiment, the perfluoroalkyl may include $-(CF_2)$ q-$CF_3$, where q>5.

In an exemplary embodiment, the group or segment containing a carbon-carbon double bond may include

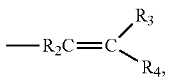

and

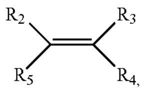

where $R_2$, $R_3$ and $R_4$ represent free ends, $R_2$, $R_3$ and $R_4$ may each independently be any one of hydrogen (H), fluorine (F), methyl $(CH)_3)$, ethyl $(-CH_2-CH_3)$, propyl and other short-chain alkyl groups, $R_5$ represents a connection end connected to a main body of the ligand, and $R_5$ may be an alkyl group or an alkyl group connected with an amide bond or an amino group.

In an exemplary embodiment, the group or segment containing a carbon-carbon double bond may be $-CF{=}CF_2$.

In an exemplary embodiment, the group containing a carbon-carbon triple bond may include

where $R_6$ represents a connection end connected to a main body of the ligand, $R_6$ may be an alkyl group or an alkyl group connected with an amide bond or an amino group, $R_7$ is a free end, $R_7$ may be any one of hydrogen (H), methyl $(CH)_3)$, ethyl $(-CH_2-CH_3)$, propyl $(-CH_2-CH_2-CH_3)$ and other short-chain alkyl groups.

When B is fluoroalkyl or perfluoroalkyl, or a group or segment containing a carbon-carbon double bond, the repulsion of the quantum dot material according to the embodiment of the present disclosure to water may be improved, and the absorption of water by the quantum dot material may be reduced, thereby reducing the adverse effect of water on the quantum dot material.

When B is a group or segment containing a carbon-carbon double bond or a carbon-carbon triple bond, since the group or segment containing the carbon-carbon double bond or carbon-carbon triple bond may easily be oxidized by oxygen, the quantum dot material according to the embodiment of the present disclosure may consume a part of oxygen in the QLED device. The group or segment containing the carbon-carbon double bond or carbon-carbon triple bond itself is located at the end of the ligand molecular of the quantum dot material according to the embodiment of the present disclosure, which has no influence on the quantum dot material itself after being oxidized, but may reduce the sensitivity of the quantum dot material to oxides such as oxygen in the environment, and may improve the oxygen tolerance of the quantum dot material according to the embodiment of the present disclosure to a certain extent.

In an exemplary embodiment, sites 1 to 8 in the general structural formula of the ligand may each independently be hydrogen and fluorine. When fluorine is contained in sites 1 to 8, the repulsion of the quantum dot material to water may be improved, and the properties of the quantum dot material are less affected by water.

In an exemplary embodiment, sites 1 to 8 in the general structural formula of the ligand may all be fluorine.

In an exemplary embodiment, the quantum dot may be selected from any one of more of CdS, CdSe, ZnSe, InP, PbS, $CsPbC_3$, $CsPbBr_3$, $CsPhI_3$, CdS/ZnS, CdSe/ZnS, ZnSe, ZnTeSe, ZnSe/ZnS, ZnTeSe/ZnS, InP/ZnS, PbS/ZnS, $CsPbC_3$/ZnS, $CsPbBr_3$/ZnS and $CsPhI_3$/ZnS.

An embodiment of the present disclosure further provides a preparation method for the quantum dot material, including the following steps:

- providing an initial quantum dot containing an oil-soluble ligand; and
- using a ligand to perform ligand exchange with the oil-soluble ligand on a surface of the initial quantum dot to obtain the quantum dot material.

In an exemplary embodiment, the step of using the ligand to perform ligand exchange with the oil-soluble ligand on the surface of the initial quantum dot to obtain the quantum dot material may include:

- dissolving the ligand in an organic solvent to obtain a ligand solution;
- adding the initial quantum dot into the ligand solution to obtain a ligand solution containing the initial quantum dot, stirring to make the ligand perform ligand exchange with the oil-soluble ligand on the surface of the initial quantum dot; and
- adding the solution after the ligand exchange into an undesirable solvent of the ligand so that the quantum dot containing the ligand is precipitated and separated from the solution to obtain the quantum dot material.

In an exemplary embodiment, in the ligand solution containing the initial quantum dot, a mass concentration of the ligand may be 3 times to 100 times a mass concentration of the initial quantum dot.

In an exemplary embodiment, a mass concentration of the ligand may be 100 mg/mL to 800 mg/mL in a ligand solution containing the initial quantum dot.

In an exemplary embodiment, a mass concentration of the initial quantum dot may be from 10 mg/mL to 30 mg/mL in a ligand solution containing the initial quantum dot.

In an exemplary embodiment, a time period for ligand exchange may be 4 hours or more, for example, 4 hours, 5 hours, 6 hours, 7 hours, etc.

In an exemplary embodiment, the organic solvent may be selected from any one or more of toluene, xylene and chloroform.

In an exemplary embodiment, the undesirable solvent may be selected from any one or more of acetone, ethyl acetate and methanol.

In an exemplary embodiment, after the quantum dot containing the ligand is precipitated, it may be separated from the solution by centrifugation, for example, the precipitate is separated from the upper solution by centrifugation, and after the upper solution is removed, an undesirable solvent is added again for centrifugation until the upper solution is clear, and the quantum dot material may be obtained after the supernatant is removed.

An embodiment of the present disclosure further provides a quantum dot display device, which may be at least one of a quantum dot light-emitting device (QLED), a Quantum Dots-Organic Light Emitting Diode (QD-OLED), a Quantum Dots-Liquid Crystal Display (QD-LCD), or a Quantum Dots-Micro Light-Emitting Diode (QD-MicroLED), and the quantum dot display device includes the quantum dot material as described above.

In an exemplary embodiment, the quantum dot display device is a QLED, which includes an anode, a cathode, and a quantum dot light-emitting layer sandwiched between the anode and the cathode, wherein the quantum dot light-emitting layer is made from the quantum dot material as described above.

In an exemplary embodiment, the quantum dot display device is at least one of QD-OLED, QD-LCD, or QD-MicroLED, and the quantum dot display device includes a color conversion layer (or color film), the material of which is the quantum dot material as described above.

An embodiment of the present disclosure further provides a display apparatus, which includes a plurality of the quantum dot display devices as described above.

The display apparatus may be any product or component with a display function, such as a mobile phone, a tablet computer, a television, a display, a laptop computer, a digital photo frame, a navigator, a vehicle-mounted display, a smart watch, and a smart bracelet.

An embodiment of the present disclosure further provides a method for patterning a quantum dot film, which includes the following steps:

forming a quantum dot film, wherein the quantum dot film is made from the quantum dot material as described above;

irradiating the quantum dot film in a retention region with ultraviolet light so that a ligand of the quantum dot material in the retention region presents a cis-structure and a quadruple hydrogen bond is formed between molecules of the ligand; and removing the quantum dot film in a non-retention region to obtain a patterned quantum dot film.

Under the irradiation of ultraviolet light, since a quadruple hydrogen bond may be formed between ligand molecules of the quantum dot material according to the embodiment of the present disclosure, the stability of the quantum dot film is improved, and the quantum dot film in the retention region is not easy to be removed. The quantum dot film in the non-retention region is not irradiated by ultraviolet light, and a hydrogen bond is formed within molecules, but no quadruple hydrogen bond is formed between molecules, therefore it is easy to be removed.

In an exemplary embodiment, a mask may be used to block the quantum dot film in the non-retention region when ultraviolet light is irradiated on the quantum dot film in the retention region.

In an exemplary embodiment, the quantum dot film of the non-retention region may be washed away with a good solvent of the quantum dot, which may be selected from any one or more of toluene and chloroform.

In an exemplary embodiment, the quantum dot light-emitting device may be in an upright structure where a first electrode is an anode and a second electrode is a cathode, and the fabricating method may include the following steps:

forming a first electrode;

forming a hole injection layer on the first electrode;

forming a hole transport layer on the hole injection layer;

forming the quantum dot light-emitting layer on the hole transport layer;

forming an electron transport layer on the quantum dot light-emitting layer; and forming the second electrode on the electron transport layer.

Figure 4:
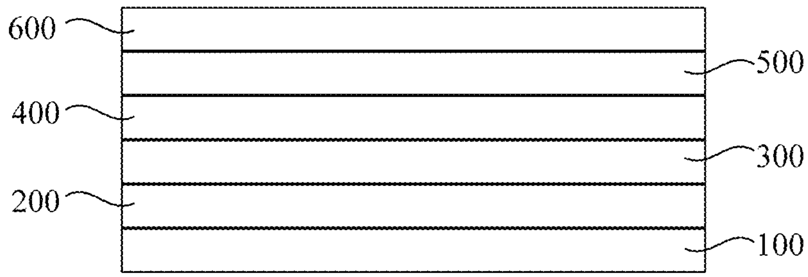
FIG. 4 is a schematic structural diagram of a QLED device with an upright structure according to an exemplary embodiment of the present disclosure.

FIG. 4 is a schematic structural diagram of a QLED device with an upright structure according to an exemplary embodiment of the present disclosure. As shown in FIG. 4, the QLED device in an upright structure may include an anode 100, a hole injection layer 200 disposed on the anode 100, a hole transport layer 300 disposed on a side of the hole injection layer 200 away from the anode 100, a quantum dot light-emitting layer 400 disposed on a side of the hole transport layer 300 away from the anode 100, an electron transport layer 500 disposed on a side of the quantum dot light-emitting layer 400 away from the anode 100, and a cathode 600 disposed on a side of the electron transport layer 500 away from the anode 100.

In an exemplary embodiment, in a QLED device in the upright structure, an anode 100 may be a bottom emission substrate conductive glass or a common glass substrate on which a conductive layer is deposited, and the conductive layer may be formed of conductive transparent materials such as Indium Tin Oxide (ITO), Indium Zinc Oxide (IZO), F-doped Tin Oxide (FTO), and the like.

The hole injection layer 200 may be prepared by spin coating, evaporation, ink jet printing or the like; PEDOT:PSS 4083 (poly (3,4-ethylene dioxythiophene)/polystyrene sulfonate) or other compounds suitable for forming a hole injection layer may be selected as the organic hole injection layer. It may also be such as NiO, $MoO_3$, $WO_3$, $V_2O_5CuO$, CuS, CuSCN, Cu: NiO and other inorganic metal oxides or sulfide materials; The film forming temperature of PEDOT may be 130° C. to 150° C., and the rotating speed of the spin coater may be set to 500 rpm to 2500 rpm to adjust the film thickness.

The hole transport layer 300 may be prepared by spin coating, evaporation, ink jet printing or the like, and the material of the hole transport layer may be selected from, for example, poly(9,9-dioctylfluorene-CO-N-(4-butylphenyl) diphenylamine) (TFB), polyvinyl carbazole (PVK), N,N'-bis(3-methylphenyl)-N,N'-diphenyl-1,1'-biphenyl-4,4'-diamine (TPD), 4,4'-bis(9-carbazole) biphenyl (CBP) and other materials suitable for forming the hole transport layer.

The quantum dot light-emitting layer 400 may be prepared by spin coating, evaporation, ink jet printing, electronic jet printing and the like, and the quantum dot for preparing the quantum dot light-emitting layer may be selected from any one or more of CdS, CdSe, ZnSe, InP, PbS, $CsPbC_3$, $CsPbBr_3$, $CsPhI_3$, CdS/ZnS, CdSe/ZnS, ZnSe, ZnTeSe, ZnSe/ZnS, ZnTeSe/ZnS, InP/ZnS, PbS/ZnS, $CsPbC_3$/ZnS, $CsPbBr_3$/ZnS and $CsPhI_3$/ZnS.

Taking the synthesis of quantum dot light-emitting layer by CdSe quantum dot as an example, the specific synthesis method is as follows: dissolving selenium powder in octadecene under the condition of inert gas and about 100° C. to obtain selenium solution; adding CdO and oleic acid into octadecene and heating to about 280° C. to obtain cadmium precursor solution; adding the selenium solution into the cadmium precursor solution, cooling to about 250° C. for reaction, cooling to room temperature after reaction, extracting with methanol-hexane to remove unreacted precursor, precipitating with ethanol and dissolving in octane to obtain CdSe initial quantum dot solution containing oil-soluble ligand oleic acid, using the ligand according to the embodiment of the present disclosure to carry out ligand exchange with the oil-soluble ligand on a surface of the initial quantum dot to obtain a quantum dot material including the ligand according to the embodiment of the present disclosure by the preparation method for the quantum dot material according to the embodiment of the present disclosure, spin coating the quantum dot material into a quantum dot film after it is dissolved (the quantum dot film may also be formed by printing, electronic jet printing, etc.), then irradiating the quantum dot film in the retention region with ultraviolet light and washing away the quantum dot film in the non-retention region with a good solvent for quantum dot to obtain a patterned quantum dot film, that is, a quantum dot light-emitting layer.

A material of the electron transport layer 500 may be selected from any one or more of alumina, barium fluoride, titanium dioxide, zinc sulfide, zirconia, zinc selenide, magnesium oxide, zinc oxide, yttrium oxide and aluminum fluoride. For example, a zinc oxide nanoparticle film, a zinc oxide sol-gel film or the like may be selected as the electron transport layer 500.

(a) Manufacturing of the zinc oxide nanoparticle film: for example, a solution obtained by dissolving 90 μl to 120 μl zinc oxide nanoparticles with a concentration of 10 mg/ml to 30 mg/ml in an alcohol solvent (e.g. methanol, ethanol, isopropanol, etc.) is dropped on the quantum dot light-emitting layer for spin coating to form the film at a rotating speed of the spin coater which is set to 500 rpm to 2500 rpm, and form the film at ambient temperature or heating (a temperature may be 25° C. to 120° C.) to adjust a thickness of the zinc oxide nanoparticle film.

(b) Manufacturing of the zinc oxide sol-gel film: adding 2 g zinc acetate into 10 mL of a mixed solvent of ethanolamine and n-butanol, spin coating to form a film, setting the rotating speed of the spin coater at 1000 rpm to 4000 rpm, and heating on a hot table at 180° C. to 250° C. to form a film.

The material of the electron transport layer 500 may also be ion-doped zinc oxide nanoparticles such as Mg, In, Al or Ga doped zinc oxide nanoparticles and the like.

The cathode 600 may be manufactured by evaporation or sputtering and may be a metal film (e.g. an Al film) or an IZO film.

In an exemplary embodiment, the quantum dot light-emitting device may be in an inverted structure where a first electrode is a cathode and a second electrode is an anode, and the fabricating method may include the following steps:

forming a first electrode;

forming an electron transport layer on the first electrode;

forming a quantum dot light-emitting layer on the electron transport layer;

forming a hole transport layer on the quantum dot light-emitting layer;

forming a hole injection layer on the hole transport layer; and forming a second electrode on the hole injection layer.

Figure 5:
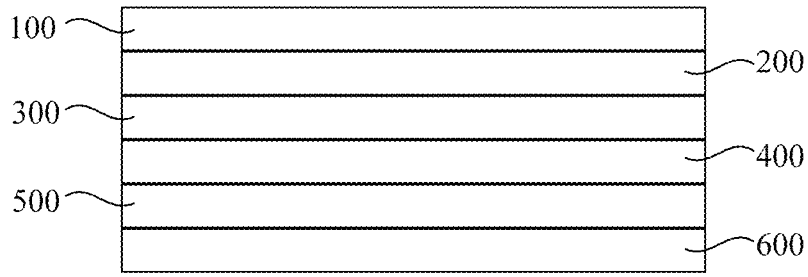
FIG. 5 is a schematic structural diagram of a QLED device with an inverted structure according to an exemplary embodiment of the present disclosure.

FIG. 5 is a schematic structural diagram of a QLED device with an inverted structure according to an exemplary embodiment of the present disclosure. As shown in FIG. 5, the QLED device in an inverted structure may include a cathode 600, an electron transport layer 500 disposed on a cathode 600, a quantum dot light-emitting layer 400 disposed on a side of the electron transport layer 500 away from the cathode 600, a hole transport layer 300 disposed on a side of the quantum dot light-emitting layer 400 away from the cathode 600, a hole injection layer 200 disposed on a side of the hole transport layer 300 away from the cathode 600, and an anode 100 disposed on a side of the hole injection layer 200 away from the cathode 600.

In an exemplary embodiment, in a QLED device in the inverted structure, the cathode 600 may be a bottom emission substrate conductive glass or a common glass substrate on which a conductive layer is deposited, and the conductive layer may be formed of a conductive transparent material such as ITO (Indian Tin Oxide), IZO (Indian Zinc Oxide), FTO (F-doped Tin Oxide), or the like.

The anode 100 may be manufactured by evaporation or sputtering and may be a metal film (e.g. an Al film) or an IZO film.

The hole injection layer 200, the hole transport layer 300, the quantum dot light-emitting layer 400, and the electron transport layer 500 can be manufactured by the same material and method as the material and the method of the QLED device in the upright structure.

An exemplary embodiment of the present disclosure provides a quantum dot material, which includes a quantum dot and a ligand modifying the quantum dot, wherein the ligand is coordinately bound to the quantum dot, and the ligand has a general structural formula of:

Formula (I)

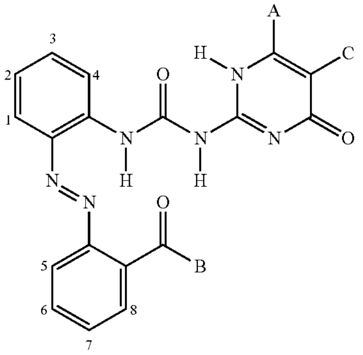

where sites 1 to 8 are all hydrogen; A is $(CH_2)_X$—Y, where 0≤x≤12, and Y is mercapto, hydroxyl, amine, amino, carboxyl, ester, phosphine or phosphine oxy (or phosphine oxide); B is —O—$CH_3$; and C is hydrogen.

For example, A may be —$(CH_2)_5$—SH, in which case the ligand is a compound represented by formula (II).

Formula (II)

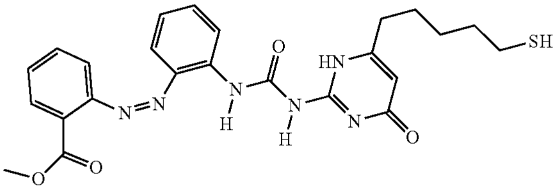

Figure 6:
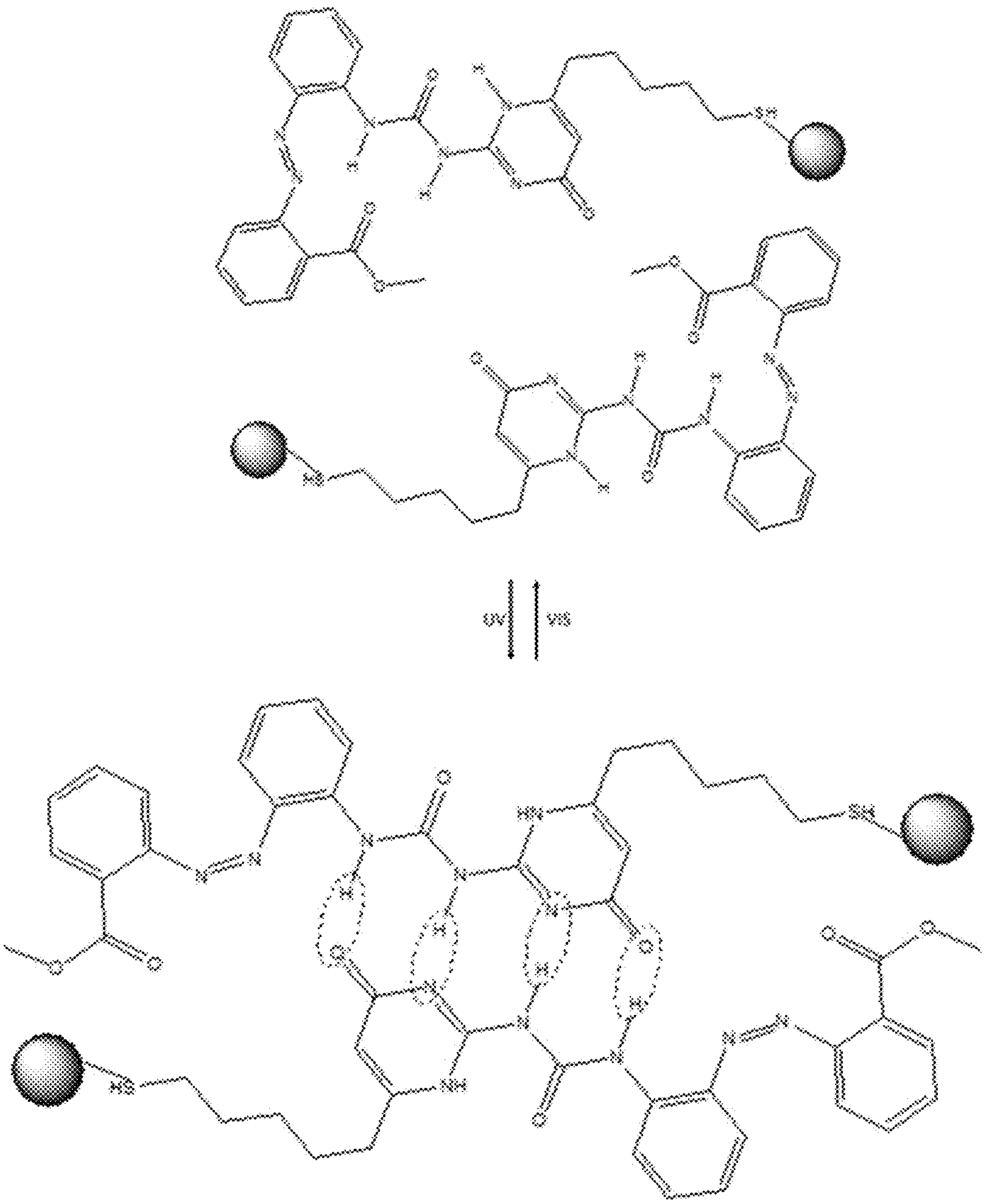
FIG. 6 is a transition diagram of a quantum dot material undergoing cis/anti-conformational changes under ultraviolet/visible light according to an exemplary embodiment of the present disclosure.

FIG. 6 is a transition diagram of a quantum dot material, in which a ligand is a compound represented by formula (II), undergoing cis/anti-conformational changes under ultraviolet/visible light according to an exemplary embodiment of the present disclosure.

The preparation method for the quantum dot material includes the following steps:

(1) providing an initial quantum dot containing an oil-soluble ligand such as oleamine and oleic acid;

(2) adding a ligand represented by formula (II) to an organic solvent (e.g., toluene, xylene, chloroform and a mixed solvent thereof) to obtain a ligand solution;

(3) adding the initial quantum dot into the ligand solution to obtain a ligand solution containing the initial quantum dot, wherein in the ligand solution containing the initial quantum dot, a concentration of the ligand may be 100 mg/mL to 800 mg/mL, and a concentration of the initial quantum dot may be 10 mg/mL to 30 mg/mL; stirring the ligand solution containing the initial quantum dot sufficiently for 4 hours or more (e.g., 4 hours, 5 hours, 6 hours, 7 hours) to perform ligand exchange of the ligand represented by formula (II) with the oil-soluble ligand on a surface of the initial quantum dot; and (4) dropwise adding the solution after the ligand exchange in step (3) into an undesirable solvent of the ligand represented by formula (II) (for example, acetone, ethyl acetate, methanol and a mixed solvent thereof), to precipitate the quantum dot including the ligand, separating the precipitate from an upper solution by centrifugation, removing the upper solution, adding the undesirable solvent for centrifugation again until the upper solution is clear, and removing the supernatant to obtain the quantum dot material.

An exemplary embodiment of the present disclosure provides a quantum dot material, which includes a quantum dot and a ligand modifying the quantum dot, wherein the ligand is coordinately bound to the quantum dot, and the ligand has a general structural formula of:

Formula (I)

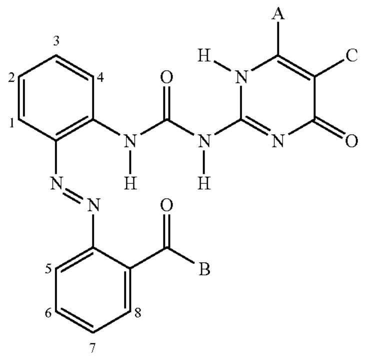

where sites 1 to 8 are all hydrogen; A is $(CH_2)_X$—Y, where $0 \leq x \leq 12$, and Y is mercapto, hydroxyl, amine, amino, carboxyl, ester, phosphine or phosphine oxy (or phosphine oxide); C is hydrogen;

B may be a long chain alkane, for example

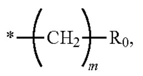

where $m \geq 10$, and $R_0$ is —$CH_3$ or phenyl; or,

B is a group containing thiophene or polythiophene, for example, B is

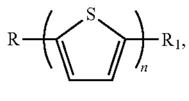

where R represents a connection end connected to a main body of the ligand, R is an alkyl group or an alkyl group connected with an amide bond or an amino group, $R_1$ represents a free end, $R_1$ is methyl, ethyl or methoxy, and $1 \leq n \leq 10$.

Specifically, B may be

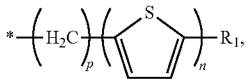

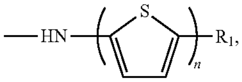 and

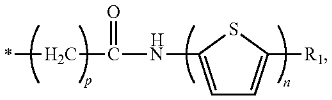

where $R_1$ represents a free end, $R_1$ is methyl, ethyl or methoxy, $p \leq 3$, and $1 \leq n \leq 10$.

The preparation method for the quantum dot material includes the following steps:

(1) providing an initial quantum dot containing an oil-soluble ligand such as oleamine and oleic acid;

(2) adding a ligand to an organic solvent (e.g., toluene, xylene, chloroform and a mixed solvent thereof) to obtain a ligand solution;

(3) adding the initial quantum dot into the ligand solution to obtain a ligand solution containing the initial quantum dot, wherein in the ligand solution containing the initial quantum dot, a concentration of the ligand may be 100 mg/mL to 800 mg/mL, and a concentration of the initial quantum dot may be 10 mg/mL to 30 mg/mL; stirring the ligand solution containing the initial quantum dot sufficiently for 4 hours or more (e.g., 4 hours, 5 hours, 6 hours, 7 hours) to perform ligand exchange of the ligand with the oil-soluble ligand on a surface of the initial quantum dot; and (4) dropwise adding the solution after the ligand exchange in step (3) into an undesirable solvent of the ligand (for example, acetone, ethyl acetate, methanol and a mixed solvent thereof), to precipitate the quantum dot including the ligand, separating the precipitate from an upper solution by centrifugation, removing the upper solution, adding the undesirable solvent for centrifugation again until the upper solution is clear, and removing the supernatant to obtain the quantum dot material.

An exemplary embodiment of the present disclosure provides a quantum dot material, which includes a quantum dot and a ligand modifying the quantum dot, wherein the ligand is coordinately bound to the quantum dot, and the ligand has a general structural formula of:

Formula (I)

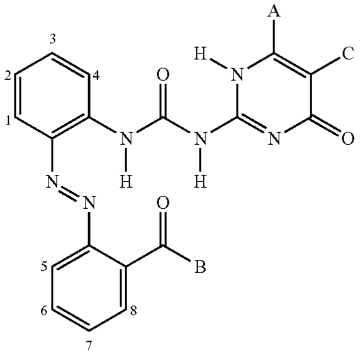

where sites 1 to 8 are all hydrogen; A is $(CH_2)_X$—Y, where 0≤x≤12, and Y is mercapto, hydroxyl, amine, amino, carboxyl, ester, phosphine or phosphine oxy (or phosphine oxide); and C is hydrogen;

B may be fluoroalkyl or perfluoroalkyl, for example, B is —$(CF_2)$ q-$CF_3$, where q>5; or, B may be a group or segment containing a carbon-carbon double bond, which may include

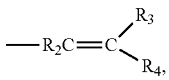
and
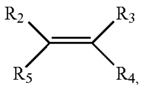

where $R_2$, $R_3$ and $R_4$ represent free ends, $R_2$, $R_3$ and $R_4$ may each independently be any one of hydrogen, fluorine, methyl, ethyl, propyl, and other short-chain alkyl groups, $R_5$ represents a connection end connected to a main body of the ligand, $R_5$ may be an alkyl group or an alkyl group connected with an amide bond or an amino group, for example, B may be perfluorofluoroalkenyl-CF═$CF_2$; or, B may be a group or segment containing a carbon-carbon triple bond, which may include

where $R_6$ represents a connection end connected to a main body of the ligand, $R_6$ may be an alkyl group or an alkyl group connected with an amide bond or an amino group, $R_7$ is a free end, $R_7$ may be any one of hydrogen, methyl, ethyl, propyl and other short-chain alkyl groups.

The preparation method for the quantum dot material includes the following steps:

(1) providing an initial quantum dot containing an oil-soluble ligand such as oleamine and oleic acid;

(2) adding a ligand to an organic solvent (e.g., toluene, xylene, chloroform and a mixed solvent thereof) to obtain a ligand solution;

(3) adding the initial quantum dot into the ligand solution to obtain a ligand solution containing the initial quantum dot, wherein in the ligand solution containing the initial quantum dot, a concentration of the ligand may be 100 mg/mL to 800 mg/mL, and a concentration of the initial quantum dot may be 10 mg/mL to 30 mg/mL; stirring the ligand solution containing the initial quantum dot sufficiently for 4 hours or more (e.g., 4 hours, 5 hours, 6 hours, 7 hours) to perform ligand exchange of the ligand with the oil-soluble ligand on a surface of the initial quantum dot; and (4) dropwise adding the solution after the ligand exchange in step (3) into an undesirable solvent of the ligand (for example, acetone, ethyl acetate, methanol and a mixed solvent thereof), to precipitate the quantum dot including the ligand, separating the precipitate from an upper solution by centrifugation, removing the upper solution, adding the undesirable solvent for centrifugation again until the upper solution is clear, and removing the supernatant to obtain the quantum dot material.

The invention claimed is:

1. A quantum dot material comprising: a quantum dot and a ligand for modifying the quantum dot, wherein the ligand is coordinately bound to the quantum dot, has a photosensitive isomerization property, is a derivative of azobenzene, and contains a urea group and a pyrimidinone group;

the ligand is configured to present a cis-structure with a quadruple hydrogen bond formed between molecules of the ligand after being irradiated by ultraviolet light, and present a trans structure with a hydrogen bond formed within the molecules of the ligand after being irradiated by visible light;

the general structural formula of the ligand is:

Formula (I)

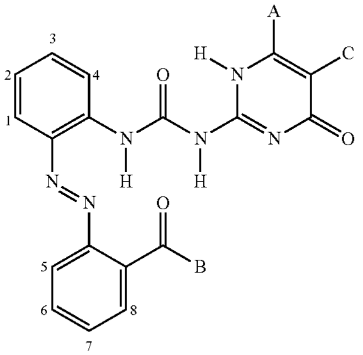

where at least one of A, B and C contains a coordination group capable of coordinately binding to the quantum dot; the coordination group is selected from any one or more of mercapto, hydroxyl, amine, amino, carboxyl, ester, phosphine and phosphine oxy.

2. The quantum dot material according to claim 1, wherein A is $(CH_2)_X$—Y, where 0≤x≤12, and Y is the coordination group; and C is hydrogen; or A is Hydrogen; and C is $(CH_2)_X$—Y, where 0≤x≤12, and Y is the coordination group.

3. The quantum dot material according to claim 2, wherein B is selected from any one of the following groups:

(1) —O—$CH_3$; or (2)

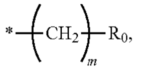

where m≥10, and $R_0$ is —$CH_3$ or phenyl;

(3) a group containing thiophene or polythiophene;

(4) fluoroalkyl or perfluoroalkyl;

(5) a group or segment containing a carbon-carbon double bond; and (6) a group or segment containing a carbon-carbon triple bond.

4. The quantum dot material according to claim 3, wherein the group containing thiophene or polythiophene comprises

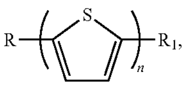

where R represents a connection end connected to a main body of the ligand, R is an alkyl group or an alkyl group connected with an amide bond or an amino group, R1 represents a free end, R1 is methyl, ethyl or methoxy, and 1≤n≤10.

5. The quantum dot material according to claim 4, wherein the group containing thiophene or polythiophene comprises

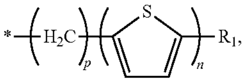

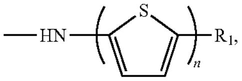

and

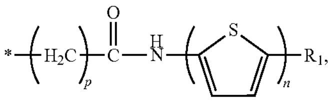

where $R_1$ represents a free end, $R_1$ is methyl, ethyl or methoxy, $p \leq 3$, and $1 \leq n \leq 10$.

6. The quantum dot material according to claim 3, wherein the perfluoroalkyl comprises —$(CF_2)$ q-$CF_3$, where q>5.

7. The quantum dot material according to claim 3, wherein the group or segment containing a carbon-carbon double bond comprises

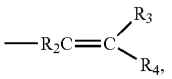

and

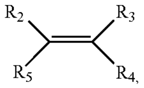

where, $R_2$, $R_3$ and $R_4$ represent free ends, $R_2$, $R_3$ and $R_4$ are each independently any one of hydrogen, fluorine, methyl, ethyl and propyl, $R_5$ represents a connection end connected to a main body of the ligand, $R_5$ is an alkyl group or an alkyl group connected with amide bond or amino group;

the group containing a carbon-carbon triple bond comprises

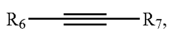

where $R_6$ represents a connection end connected to a main body of the ligand, $R_6$ is an alkyl group or an alkyl group connected with an amide bond or an amino group, $R_7$ is a free end, and $R_7$ is any one of hydrogen, methyl, ethyl, and propyl.

8. The quantum dot material according to claim 1, wherein in the general structural formula of the ligand, sites 1 to 8 are each independently hydrogen and fluorine, wherein in the general structural formula of the ligand, sites 1 to 8 are all fluorine.

9. The quantum dot material according to claim 1, wherein the quantum dot is selected from any one or more of CdS, CdSe, ZnSe, InP, PbS, $CsPbCl_3$, $CsPbBr_3$, $CsPhI_3$, CdS/ZnS, CdSe/ZnS, ZnSe, ZnTeSe, ZnSe/ZnS, ZnTeSe/ZnS, InP/ZnS, PbS/ZnS, $CsPbCl_3$/ZnS, $CsPbBr_3$/ZnS and $CsPhI_3$/ZnS.

10. A preparation method for the quantum dot material according to claim 1, comprising the following steps:

providing an initial quantum dot containing an oil-soluble ligand; and using a ligand to perform ligand exchange with the oil-soluble ligand on a surface of the initial quantum dot to obtain the quantum dot material.

11. The preparation method according to claim 10, wherein the step of using the ligand to perform ligand exchange with the oil-soluble ligand on the surface of the initial quantum dot to obtain the quantum dot material comprises:

dissolving the ligand in an organic solvent to obtain a ligand solution;

adding the initial quantum dot into the ligand solution to obtain a ligand solution containing the initial quantum dot, stirring to make the ligand perform ligand exchange with the oil-soluble ligand on the surface of the initial quantum dot; and adding the solution after the ligand exchange into an undesirable solvent of the ligand so that the quantum dot containing the ligand is precipitated and separated from the solution to obtain the quantum dot material.

12. The preparation method according to claim 11, wherein in the ligand solution containing the initial quantum dot, a mass concentration of the ligand is 3 times to 100 times a mass concentration of the initial quantum dot; or in the ligand solution containing the initial quantum dot, a mass concentration of the ligand is from 100 mg/mL to 800 mg/mL, and a mass concentration of the initial quantum dot is from 10 mg/mL to 30 mg/mL.

13. The preparation method according to claim 11, wherein a time period for ligand exchange is 4 hours or more;

the organic solvent is selected from any one or more of toluene, xylene and chloroform; and the undesirable solvent is selected from any one or more of acetone, ethyl acetate and methanol.

14. A quantum dot display device, which is at least one of a quantum dot light-emitting device, a quantum dot-organic light emitting diode, a quantum dot-liquid crystal display device, or a quantum dot-miniature light emitting diode, the quantum dot display device comprising the quantum dot material according to claim 1.

15. The quantum dot display device according to claim 14, wherein the quantum dot display device is a quantum dot light-emitting device comprising an anode, a cathode, and a quantum dot light-emitting layer sandwiched between the anode and the cathode, and a material of the quantum dot light-emitting layer is the quantum dot material; or the quantum dot display device is at least one of a quantum dot-organic light emitting diode, a quantum dot-liquid crystal display device, or a quantum dot-miniature light emitting diode, the quantum dot display device comprising a color conversion layer made of the quantum dot material.

16. A display apparatus, comprising the quantum dot display device according to claim 14.

17. A method for patterning a quantum dot film, comprising the following steps:

forming a quantum dot film made of the quantum dot material according to claim 1;

irradiating the quantum dot film in a retention region with ultraviolet light so that a ligand of the quantum dot material in the retention region presents a cis-structure and a quadruple hydrogen bond is formed between molecules of the ligand; and removing the quantum dot film in a non-retention region to obtain a patterned quantum dot film.

18. A method for fabricating a quantum dot light-emitting device, comprising the following steps:

forming a first electrode;

forming a patterned quantum dot film as a quantum dot light-emitting layer by adopting the method for patterning the quantum dot film according to claim 17; and forming a second electrode.

* * * * *